United States Patent
Fenzi et al.

(10) Patent No.: US 10,366,194 B2
(45) Date of Patent: *Jul. 30, 2019

(54) ELEMENT REMOVAL DESIGN IN MICROWAVE FILTERS

(71) Applicant: RESONANT LLC, Goleta, CA (US)

(72) Inventors: Neal Fenzi, Santa Barbara, CA (US); Kurt Raihn, Goleta, CA (US)

(73) Assignee: Resonant Inc., Santa Barbara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/300,124

(22) Filed: Jun. 9, 2014

(65) Prior Publication Data

US 2014/0289692 A1 Sep. 25, 2014

Related U.S. Application Data

(63) Continuation of application No. 13/939,763, filed on Jul. 11, 2013, now Pat. No. 8,751,993.

(Continued)

(51) Int. Cl.
*G06F 17/50* (2006.01)
*H03H 9/46* (2006.01)
(Continued)

(52) U.S. Cl.
CPC ...... *G06F 17/5072* (2013.01); *G06F 17/5045* (2013.01); *G06F 17/5063* (2013.01);
(Continued)

(58) Field of Classification Search
CPC ............ G06F 17/5036; G06F 17/5063; G06F 17/5081; G06F 17/5072; G06G 7/48; G06G 7/50; H03F 3/45; H03H 7/00
(Continued)

(56) References Cited

U.S. PATENT DOCUMENTS

| 1,795,204 A | 3/1931 | Espenschied |
| 4,653,118 A | 3/1987 | de Jong |
| | (Continued) | |

FOREIGN PATENT DOCUMENTS

| EP | 1455448 | 9/2004 |
| JP | 61007702 A | 1/1986 |

OTHER PUBLICATIONS

PCT International Search Report for PCT/US2014/019106, Applicant: Resonant LLC, Form PCT/ISA/210 and 220, dated Jun. 25, 2014 (4pages).

(Continued)

*Primary Examiner* — Phallaka Kik

(74) *Attorney, Agent, or Firm* — Foley & Lardner LLP; Daniel Rose

(57) ABSTRACT

A method of designing a microwave filter using a computerized filter optimizer, comprises generating a filter circuit design in process (DIP) comprising a plurality of circuit elements having a plurality of resonant elements and one or more non-resonant elements, optimizing the DIP by inputting the DIP into the computerized filter optimizer, determining that one of the plurality of circuit elements in the DIP is insignificant, removing the one insignificant circuit element from the DIP, deriving a final filter circuit design from the DIP, and manufacturing the microwave filter based on the final filter circuit design.

27 Claims, 12 Drawing Sheets

Related U.S. Application Data

(60) Provisional application No. 61/802,114, filed on Mar. 15, 2013.

(51) Int. Cl.

| | | |
|---|---|---|
| *H03H 7/00* | (2006.01) | |
| *G06G 7/48* | (2006.01) | |
| *H03F 3/45* | (2006.01) | |
| *G06G 7/50* | (2006.01) | |

(52) U.S. Cl.
CPC .......... *H03H 9/46* (2013.01); *G06F 17/5036* (2013.01); *G06F 17/5081* (2013.01); *G06G 7/48* (2013.01); *G06G 7/50* (2013.01); *H03F 3/45* (2013.01); *H03H 7/00* (2013.01)

(58) Field of Classification Search
USPC ...... 716/122, 123, 128, 130, 132; 703/4, 15; 330/260; 333/175
See application file for complete search history.

(56) References Cited

U.S. PATENT DOCUMENTS

| | | | | |
|---|---|---|---|---|
| 4,661,789 | A  * | 4/1987 | Rauscher | 333/202 |
| 7,639,101 | B2 | 12/2009 | Tsuzuki et al. | |
| 7,719,382 | B2 | 5/2010 | Tsuzuki et al. | |
| 7,764,146 | B2 * | 7/2010 | Yu et al. | 333/202 |
| 7,863,999 | B2 | 1/2011 | Tsuzuki et al. | |
| 7,924,114 | B2 | 4/2011 | Tsuzuki et al. | |
| 8,026,776 | B2 | 9/2011 | Ueda et al. | |
| 8,063,714 | B2 | 11/2011 | Tsuzuki et al. | |
| 8,063,717 | B2 | 11/2011 | Bradley et al. | |
| 8,676,550 | B1 * | 3/2014 | Reeves | 703/2 |
| 8,742,871 | B2 * | 6/2014 | Jin et al. | 333/175 |
| 9,754,060 | B2 * | 9/2017 | Turner | G06F 17/505 |
| 9,787,283 | B2 * | 10/2017 | Tsuzuki | H03H 9/465 |
| 9,934,345 | B2 * | 4/2018 | Turner | G06F 17/505 |
| 10,027,310 | B2 * | 7/2018 | Tsuzuki | H03H 7/0153 |
| 2004/0044970 | A1 * | 3/2004 | Anderson et al. | 716/1 |
| 2004/0044971 | A1 | 3/2004 | McConaghy | |
| 2006/0202775 | A1 | 9/2006 | Tsuzuki et al. | |
| 2009/0002102 | A1 | 1/2009 | Tsuzuki et al. | |
| 2009/0160576 | A1 * | 6/2009 | Dent | 333/139 |
| 2009/0309678 | A1 | 12/2009 | Yu et al. | |
| 2011/0156987 | A1 | 6/2011 | Magnusson et al. | |
| 2014/0137069 | A1 * | 5/2014 | Duff et al. | 716/132 |
| 2017/0364611 | A1 * | 12/2017 | Turner | H03H 3/00 |
| 2018/0011960 | A1 * | 1/2018 | Fenzi | G06F 17/5045 |
| 2018/0013403 | A1 * | 1/2018 | Tsuzuki | H03H 9/6406 |

OTHER PUBLICATIONS

PCT Written Opinion of the International Search Authority for PCT/USUS2014/019106, Applicant: Resonant LLC, Form PCT/ISA/237, dated Jun. 25, 2014 (8pages).

Giraud, S. et al., Bulk Acoustic Wave Filters Synthesis and Optimization for Multi-Standard Communication Terminals, IEEE Transactions on Ultrasonics, Ferroelectrics and Frequency Control, IEEE, US, vol. 57, No. 1, Jan. 2010, pp. 52-58.

Campbell, George A., Physical Theory of the Electric Wave-Filter, The Bell System Technical Journal, vol. I, No. 2 (Nov. 1992).

Ikata, O. et al., Development of Low-Loss Band-Pass Filters Using Saw Resonators for Portable Telephones, 1992 Ultrasonic Symposium, pp. 111-115.

Matthaei, George L. et al., Microwave Filters, Impedance-Matching Networks, and Coupling Structures, McGraw-Hill Book Company, pp. 95-97, 438-440 (1964).

Morgan, David, Suface Acoustic Wave Filters with Applications to Electronic Communications and Signal Processing, pp. 335-339, 352-354 (2007).

Van Dyke, K.S., The Piezo-Electric Resonator and its Equivalent Network Proc. IRE, vol. 16, 1928, pp. 742-764.

Zhou, Jiafeng, Microwave Filters, 2010, (27pages).

Zobel, Otto J., Theory and Design of Uniform and Composite Electric Wave-Filters, The Bell System Technical Journal, vol. II, No. 1 (Jan. 1923).

File History of U.S. Appl. No. 61/798,482, entitled "Image Method for Filter Design," filed Mar. 15, 2013.

File History of U.S. Appl. No. 13/838,943, entitled "Network Synthesis Design of Microwave Acoustic Wave Filters," filed Mar. 15, 2013.

Ken-ya Hashimoto, Surface Acoustic Wave Devices in Telecommunications, Springer, 2000, chapter 5.4—"Impedance Element Filters" especially figures 5.41 and 5.42.

W.P. Mason, Electrical Wave Filters Employing Quartz Crystals as Elements, The Bell System Technical Journal (1934).

File History of U.S. Appl. No. 13/934,051, entitled "Improved Design of Microwave Acoustic Wave Filters," filed Jul. 2, 2013.

File History of U.S. Appl. No. 13/939,065, entitled "Improved Design of Microwave Acoustic Wave Filters," filed Jul. 10, 2013.

Kuo et al., Periodic Stepped-Impedance Ring Resonator (PSIRR) Bandpass Filter with a Miniaturized Area and Desirable Upper Stopband Characteristics, IEEE Transactionsof Microwave Theory and Techniques, vol. 54, No. 3, Mar. 2006, pp. 1107-1112.

Sun et al., Coupling Dispersing of Parallel-Coupled Microstrip Lines for Dual Band Filters with Controllable Fractional Pass Bandwidths, 2005, IEEE, pp. 2195-2198.

Andreevskii et al, Russian Patent Application Document No. RU-2371840 C2, Published Oct. 27, 2009, 3pages.

* cited by examiner

ELEMENT REMOVAL DESIGN IN MICROWAVE FILTERS

RELATED APPLICATION DATA

The present application is a continuation of U.S. application Ser. No. 13/939,763, filed Jul. 11, 2013, which claims the benefit under 35 U.S.C. § 119 to U.S. provisional patent application Ser. No. 61/802,114, filed Mar. 15, 2013, which applications are all incorporated herein by reference in their entirety.

FIELD OF THE INVENTION

The present inventions generally relate to microwave filters, and more particularly, to acoustic wave microwave filters designed for narrow-band applications.

BACKGROUND OF THE INVENTION

Electrical filters have long been used in the processing of electrical signals. In particular, such electrical filters are used to select desired electrical signal frequencies from an input signal by passing the desired signal frequencies, while blocking or attenuating other undesirable electrical signal frequencies. Filters may be classified in some general categories that include low-pass filters, high-pass filters, bandpass filters, and band-stop filters, indicative of the type of frequencies that are selectively passed by the filter. Further, filters can be classified by type, such as Butterworth, Chebyshev, Inverse Chebyshev, and Elliptic, indicative of the type of bandshape frequency response (frequency cutoff characteristics).

The type of filter used often depends upon the intended use. In communications applications, band pass and band stop filters are conventionally used in cellular base stations, cell phone handsets, and other telecommunications equipment to filter out or block RF signals in all but one or more predefined bands. Of most particular importance is the frequency range from approximately 500-3,500 MHz.

With reference to FIG. 1 a prior art telecommunications system 10 may include a transceiver 12 capable of transmitting and receiving wireless signals, and a controller/processor 14 capable of controlling the functions of the transceiver 12.

The transceiver 12 generally comprises a broadband antenna 16, a duplexer 18 having a transmit filter 24 and a receive filter 26, a transmitter 20 coupled to the antenna 16 via the transmit filter 24 of the duplexer 18, and a receiver 22 coupled to the antenna 16 via the receive filter 26 of the duplexer 18.

The transmitter 20 includes an upconverter 28 configured for converting a baseband signal provided by the controller/processor 14 to a radio frequency (RF) signal, a variable gain amplifier (VGA) 30 configured for amplifying the RF signal, a bandpass filter 32 configured for outputting the RF signal at an operating frequency selected by the controller/processor 14, and a power amplifier 34 configured for amplifying the filtered RF signal, which is then provided to the antenna 16 via the transmit filter 24 of the duplexer 18.

The receiver 22 includes a notch or stopband filter 36 configured for rejecting transmit signal interference from the RF signal input from the antenna 16 via the receiver filter 26, a low noise amplifier (LNA) 38 configured for amplifying the RF signal from the stop band filter 36 with a relatively low noise, a tunable bandpass filter 40 configured for outputting the amplified RF signal at a frequency selected by the controller/processor 14, and a downconverter 42 configured for downconverting the RF signal to a baseband signal that is provided to the controller/processor 14. Alternatively, the function of rejecting transmit signal interference performed by the stop-band filter 36 can instead be performed by the duplexer 18. Or, the power amplifier 34 of the transmitter 20 can be designed to reduce the transmit signal interference.

It should be appreciated that the block diagram illustrated in FIG. 1 is functional in a nature, and that several functions can be performed by one electronic component or one function can be performed by several electronic components. For example, the functions performed by the up converter 28, VGA 30, bandpass filter 40, downconverter 42, and controller/processor 14 are oftentimes performed by a single transceiver chip. The function of the bandpass filter 32 can be into the power amplifier 34 and the transmit filter 24 of the duplexer 18.

Microwave filters are generally built using two circuit building blocks: a plurality of resonators, which store energy very efficiently at a resonant frequency (which may be a fundamental resonant frequency $f_0$ or any one of a variety of higher order resonant frequencies $f_1$-$f_n$); and couplings, which couple electromagnetic energy between the resonators to form multiple reflection zeros providing a broader spectral response. For example, a four-resonator filter may include four reflection zeros. For the purposes of this specification, a reflection zero may refer to the roots of a filter's reflection function where the inductance and capacitance cancel and a minimum amount of power is reflected. The strength of a given coupling is determined by its reactance (i.e., inductance and/or capacitance). The relative strengths of the couplings determine the filter shape, and the topology of the couplings determines whether the filter performs a band-pass or a band-stop function. The resonant frequency $f_0$ is largely determined by the inductance and capacitance of the respective resonator. For conventional filter designs, the frequency at which the filter is active is determined by the resonant frequencies of the resonators that make up the filter. Each resonator must have very low internal resistance to enable the response of the filter to be sharp and highly selective for the reasons discussed above. This requirement for low resistance tends to drive the size and cost of the resonators for a given technology.

The front-end receive filter (e.g., the receive filter 26 illustrated in FIG. 1) preferably takes the form of a sharply defined band-pass filter to eliminate various adverse effects resulting from strong interfering signals at frequencies near the desired received signal frequency. Because of the location of the front-end receiver filter at the antenna input, the insertion loss must be very low so as to not degrade the noise figure. In most filter technologies, achieving a low insertion loss requires a corresponding compromise in filter steepness or selectivity. In practice, most filters for cell phone handsets are constructed using acoustic resonator technology, such as surface acoustic wave (SAW), bulk acoustic wave (BAW), and film bulk acoustic resonator (FBAR) technologies. Such acoustic resonator filters have the advantages of low insertion loss, compact size, and low cost compared to equivalent inductor/capacitor resonators.

Design of practical microwave filters may begin with the design of an initial circuit generated, for instance, using image design or network synthesis design. These approaches generally, from the outset, only consider circuits with the fewest possible number of circuit elements. This is generally performed from a desire to minimize losses in the final filter, and may be a common practice in microwave filter design of all types. The initial design may be generated using simplified, idealized circuit element models, which may typically ignore losses and other unwanted characteristics of the physical circuit elements used to make the final filter. Computer optimization may be a critical and necessary step in the design of practical microwave filters. Design tools including Agilent Advanced Design System (ADS), among others, may use numerical optimization methods, such as Monte Carlo, gradient, etc., to improve the "initial circuit design." This computer optimization step may use increasingly realistic, accurate circuit element models and may restrict circuit element values to those that can be manufactured in accordance with the final filter design. The optimization may search for the combination of circuit element values that best matches the desired filter response. This type of computer optimization may be often used in microwave filter design. Although the optimization may generally produce a significantly improved design that may be realized with physical circuit elements, it generally does not reduce the number of circuit elements in the final circuit design from the number of circuit elements in the initial circuit design, nor does it change one type of circuit element into another.

For example, one initial circuit that is typically used in the design of acoustic wave band-pass filters is a ladder filter 50, which comprises a number of alternating shunt resonators 52a and series resonators 52b, as illustrated in FIG. 2. The filter 50 can be considered an N resonator ladder topology (i.e., N equals the number of resonators, and in this case 6). For the purposes of this specification, an acoustic ladder filter may refer to one or more filters using the Mason-type acoustic wave ladder circuit structure comprising alternating series and shunt acoustic wave resonators.

Each of the acoustic resonators 52 may be described by a modified Butterworth-Van Dyke (MBVD) model 54. MBVD models 54 may also describe SAW resonators, which may be fabricated by disposing interdigital transducers (IDTs) on a piezoelectric substrate, such as crystalline Quartz, Lithium Niobate (LiNbO$_3$), Lithium Tantalate (LiTaO$_3$) crystals or BAW resonators. Each MBVD model 54 includes a motional capacitance C$_m$ 56, a static capacitance C$_0$ 58, a motional inductance L$_m$ 60, and a resistance R 62. The motional capacitance C$_m$ 56 and motional inductance L$_m$ 60 may result from the interactions of electrical and acoustical behavior, and thus, may be referred to as the motional arm of the MBVD model 54. The static capacitance C$_0$ 58 may result from the inherent capacitance of the structure, and thus, may be referred to as the static (non-motional) capacitance of the MBVD model 54. The resistance R 62 may result from the electrical resistance of the acoustic resonator 52. The parameters are related by the following equations:

$$\omega_E = \frac{1}{\sqrt{L_M C_M}};$$ [1]

$$\frac{\omega_A}{\omega_R} = \sqrt{1 + \frac{1}{\gamma}},$$ [2]

where $\omega_R$ and $\omega_A$ may be the respective resonance and anti-resonance frequencies for any given acoustic resonator, and gamma γ may depend on a material's property, which may be further defined by:

$$\frac{C_0}{C_m} = \gamma.$$ [3]

Typical γ values may range from about 12 to about 18 for 42-degree X Y cut LiTaO$_3$.

It can be appreciated from equation [1] that the resonant frequency of each of the acoustic resonators 52 will depend on the motional arm of the MBVD model 54, whereas the filter characteristics (e.g., bandwidth) will be determined by γ in equation [2]. The Quality factor (Q) for an acoustic resonator 52 may be an important figure of merit in acoustic filter design, relating to the loss of the element within the filter. Q of a circuit element represents the ratio of the energy stored per cycle to the energy dissipated per cycle. The Q factor models the real loss in each acoustic resonator 52, and generally more than one Q factor may be required to describe the loss in an acoustic resonator 52. Q factors may be defined as follows for the filter examples. The motional capacitance C$_m$ 56 may have an associated Q defined as QC$_m$=1.0E+8; the static capacitance C$_0$ 58 may have an associated Q defined as QC$_0$=200; and motional inductance L$_m$ 60 may have an associated Q defined as QL$_m$=1000. Circuit designers may typically characterize SAW resonators by resonant frequency $\omega_R$, static capacitance C$_0$, gamma γ, and Quality factor QL$_m$. For commercial applications, QL$_m$ may be about 1000 for SAW resonators, and about 3000 for BAW resonators.

The frequency response for the filter 50 is illustrated in FIG. 3 which presents the scattering matrices |S21|$^2$ (insertion loss) and |S11|$^2$ (return loss) for the filter response in logarithmic units of decibels (dB) versus frequency f. Let the resonance and anti-resonance frequencies of each of the shunt resonators 52a be respectively designated as $\omega_{rp}$ and $\omega_{ap}$, and the resonance and anti-resonance frequencies of each of the series resonators 52b be respectively designated as $\omega_{rs}$ and $\omega_{as}$. When $\omega_{rs}$ and $\omega_{ap}$ are approximately equal to each other, a passband centered near $\omega=\omega_{rs}$, $\omega_{ap}$ is created, and transmission zeroes at $\omega=\omega_{rp}$, $\omega_{as}$ defining the passband edges are created, as shown in the filter response illustrated in FIG. 3. For the purposes of this specification, a transmission zero may refer to the roots of a filter's transmission function where a maximum amount of power is reflected. At frequencies f far from the passband center frequency $\omega_p$ the resonators act approximately as capacitors, resulting in a |S21|$^2$ filter response that forms wings that becomes asymptotically constant for large |ω-$\omega_p$|, providing the out-of-band rejection.

A band pass filter response may be characterized by the return loss (i.e., the value of the |S11|$^2$ at the center passband frequency $\omega_p$), insertion loss (i.e., the value of |S21|$^2$ at the center passband frequency $\omega_p$, the passband width (PBW), and the out-of-band rejection ε (i.e., 1/|S21| at a large |ω-$\omega_p$|). Band pass ladder filters can be designed only over a limited accessible range of these parameters, with the range depending on the material parameter value γ and the number of resonators (termed the filter order). The material parameter values γ for currently widely used materials for SAW and BAW filters are in the range of 12-14, allowing the resonance frequency and antiresonance frequency to be close to the passband center frequency $\omega_p$, thereby creating a relatively narrow passband in the |S21|$^2$ filter response. Materials with a material parameter value γ of 4 are currently under development. A smaller material parameter value γ would enable a wider passband width PBW, decrease return loss RL, or improve the out-of-band rejection ε.

For a fixed passband width PBW, as the out-of-band rejection ε increases, the return loss RL decreases. In some cases, passive circuit elements are coupled to the ladder structure to improve filter performance. For example, adding inductors can decrease the effective material parameter value γ, which can increase the passband width PBW, decrease the return loss RL, or improve the out-of-band rejection ε. However, the benefits from the addition of inductors come at the cost of increased insertion loss, size, and cost. The band pass filter parameters are pushed to the limits of the accessible range in order to maximize performance, with tradeoffs between the parameters depending on the system applications and requirements. Higher order filters can achieve greater out-of-band rejection ε at a given passband return loss RL and passband width PBW.

As briefly discussed above, the filter 50 may have an initial circuit design, which may then be optimized via a suitable computer optimization technique (e.g., Agilent ADS software) to create a final circuit design. For example, the filter 50 may initially be designed with the resonant frequencies $\omega_R$ and static capacitances $C_0$ for each resonator 52 illustrated in FIG. 4a, which when simulated, results in the frequency response illustrated in FIG. 4b. This frequency response is shown characterized by the following markers: M1 of Mag S21=−65.71 dB at frequency=1.770 GHz; M2 of Mag S21=−36.735 dB at frequency=1.830 GHz; M3 of Mag S21=−4.367 dB at frequency=1.850 GHz; M4 of Mag S21=−1.444 dB at frequency=1.879 GHz; M5 of Mag S21=−2.680 dB at frequency=1.910 GHz; M6 of Mag S21=−30.118 dB at frequency=1.930 GHz; and M7 of Mag S21=−62.874 dB at frequency=1.990 GHz.

After optimization, the filter 50 may have the resonant frequencies $\omega_R$ and static capacitances $C_0$ for each resonator 52 illustrated in FIG. 5a, which when simulated, results in the frequency response illustrated in FIG. 5b. This frequency response is shown characterized by the following markers: N1 of Mag S21=−46.943 dB at frequency=1.770 GHz; N2 of Mag S21=−29.865 dB at frequency=1.829 GHz; N3 of Mag S21=−1.479 dB at frequency=1.851 GHz; N4 of Mag S21=−0.833 dB at frequency=1.875 GHz; N5 of Mag S21=−1.898 dB at frequency=1.910 GHz; N6 of Mag S21=−41.977 dB at frequency=1.929 GHz; and N7 of Mag S21=−47.182 dB at frequency=1.990 GHz.

As can be appreciated from the foregoing, the values of the MBVD models 54 for the resonators 52 have changed with optimization with improvement in the frequency response. However, the type and number of circuit elements remains unchanged, and thus, does not reduce the footprint or cost of the final circuit. Therefore, for microwave filters generally, and especially filter designs that contain passive elements and/or use more complex design techniques, such as modern network theory or image theory with more complex sections, an improved optimization method is needed.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 4b is a frequency response plot of the initial circuit design of FIG. 4a;

FIG. 5b is a frequency response plot of the final circuit design of FIG. 5a;

FIG. 7b is a frequency response plot of the initial circuit design of FIG. 7a;

FIG. 8b is a frequency response plot of the final circuit design of FIG. 8a.

DETAILED DESCRIPTION OF THE EMBODIMENTS

The microwave filter design optimization technique optimizes an acoustic wave (AW) microwave filter (such as surface acoustic wave (SAW), bulk acoustic wave (BAW), and film bulk acoustic wave (FBAR) filters), by changing the circuit element values, changing the circuit element type, and/or discretely removing extra or unnecessary circuit elements. These elements may include inductors, capacitors, and acoustic resonators (modeled, e.g., using the modified Butterworth-Van Dyke (MBVD) model).

This optimization technique utilizes several traditional computer optimization methods to enable the improved optimization of more complex circuits in the initial design than may be possible in the prior art. These initial filter circuit designs may be produced using any design method, for instance image design or network synthesis. This optimization technique results in a final filter circuit design with a reduced number elements compared to the initial filter circuit design, while simultaneously improving the frequency response of the filter. For the purposes of this specification, a frequency response improvement may refer to an improvement in desired microwave performance of a filter (e.g., a lower insertion loss, steeper rejection slope, higher out-of-band rejection, lower node voltage, more linear group delay, etc.). Therefore, a smaller footprint, lower cost, lower insertion loss, and greater selectively filter may be achieved, while allowing the use of traditional manufacturing processes and infrastructure.

While the microwave filter design optimization technique is described herein with reference to AW filters, it should be appreciated that this technique can be utilized with other types of microwave filters where the resonant elements can be model at some level of accuracy with a MBVD model. The optimization technique may also apply to other technologies with complex resonator elements (e.g., multi-mode dielectric resonators and other similar technologies).

Figure 6:
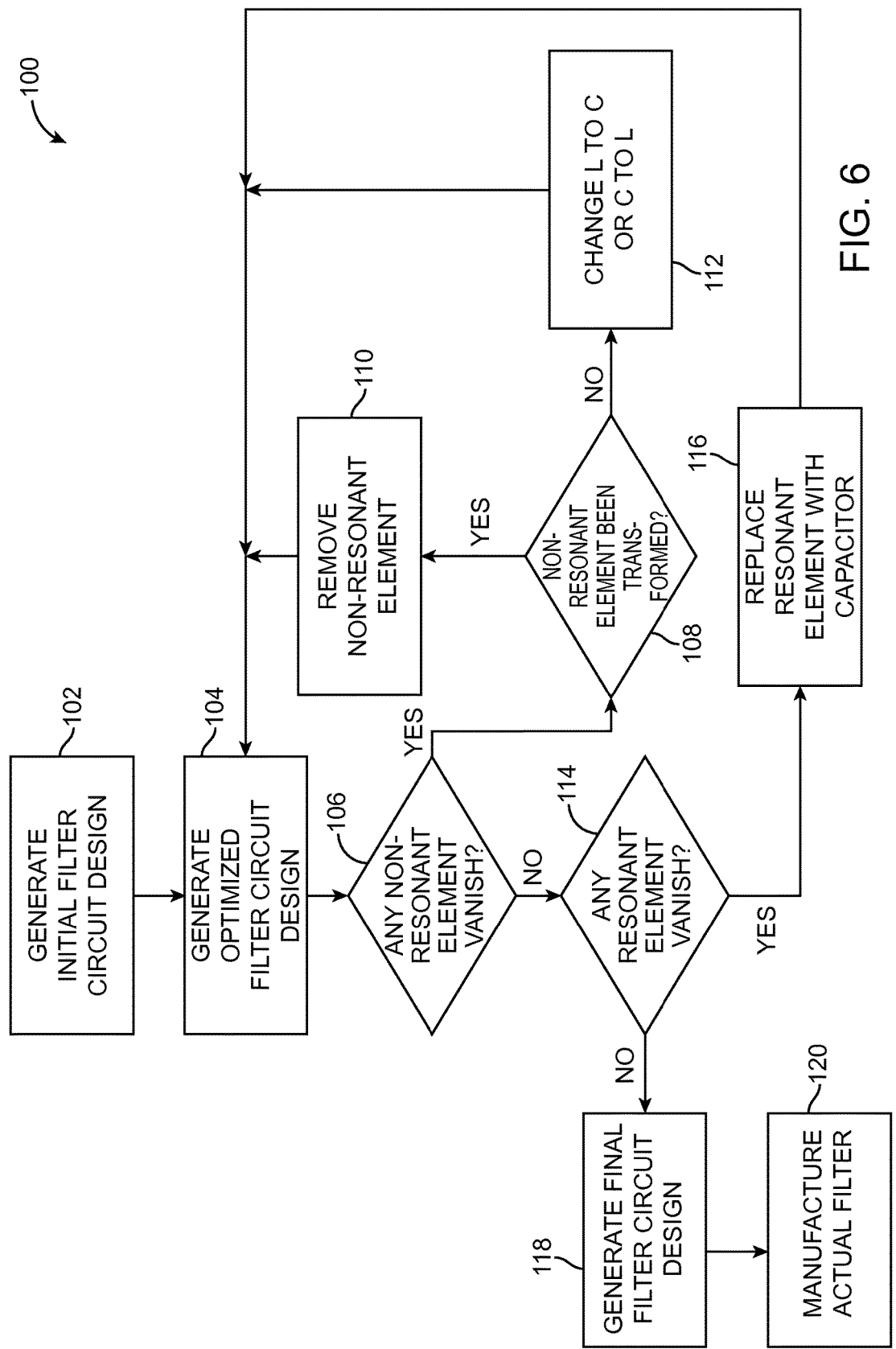
FIG. 6 is a flow diagram illustrating an Element Removal Design (ERD) technique used to optimize an acoustic ladder filter in accordance with one method of the present inventions.

Referring now to FIG. 6, one Element Removal Design (ERD) technique 100 that can be used to design an acoustic wave filter will be described. During implementation of the ERD technique 100, a design in process (DIP) is modified from an initial design to an improved final design. The method, in steps, uses computer optimization and decisions to incrementally improve the DIP to reduce circuit element count and improve performance metrics.

To this end, the ERD technique 100 first generates an initial filter circuit design based on performance specifications, such as center passband frequency, passband width, return loss, and out-of-band rejection may be generated using and image filter technique or a network synthesis technique (step 102). For the purposes of this specification, a circuit element may refer to an inductor, a capacitor, a resonator, switch or a resistor within a network of circuit interconnections.

Figure 1:
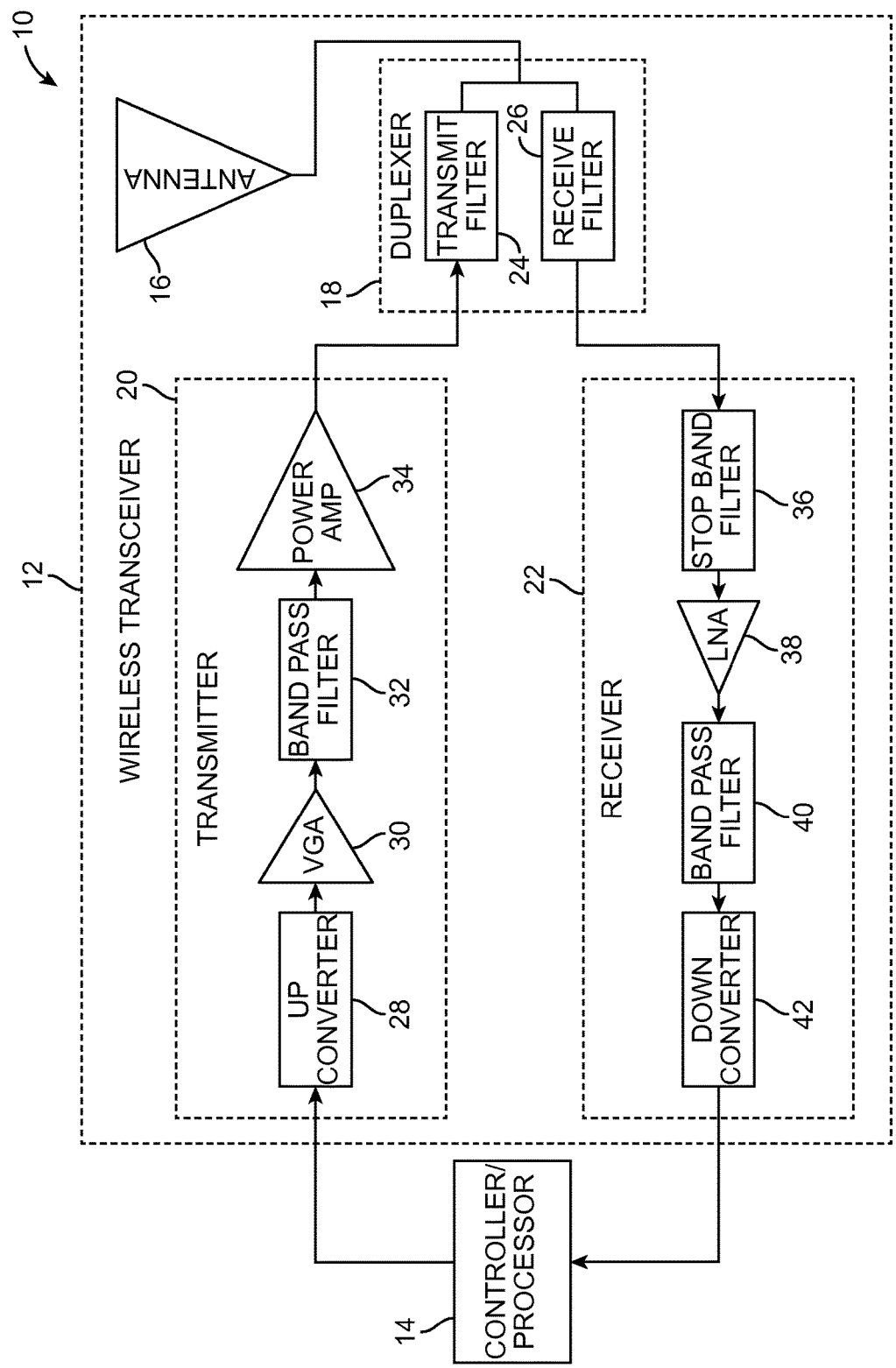
FIG. 1 is a block diagram of a prior art wireless telecommunications system.
Figure 2:
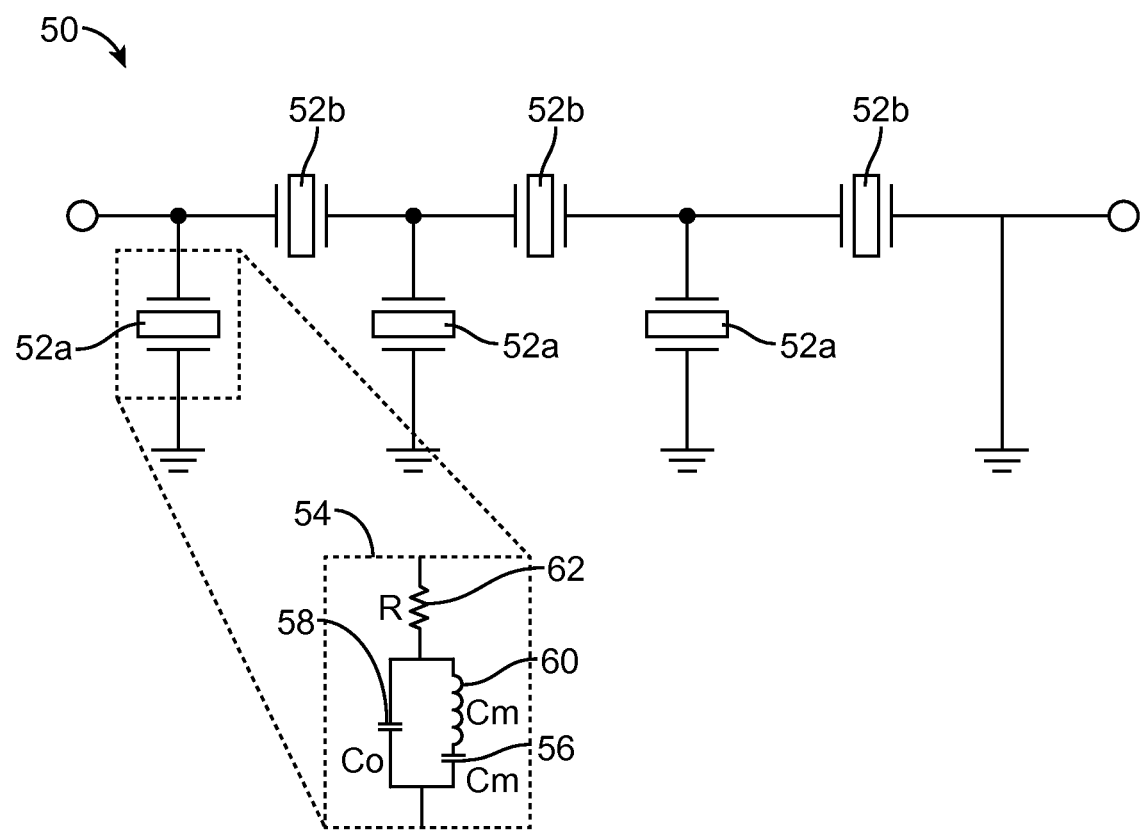
FIG. 2 is a schematic diagram of a prior art acoustic ladder filter that can be used in the prior art wireless telecommunications system.
Figure 3:
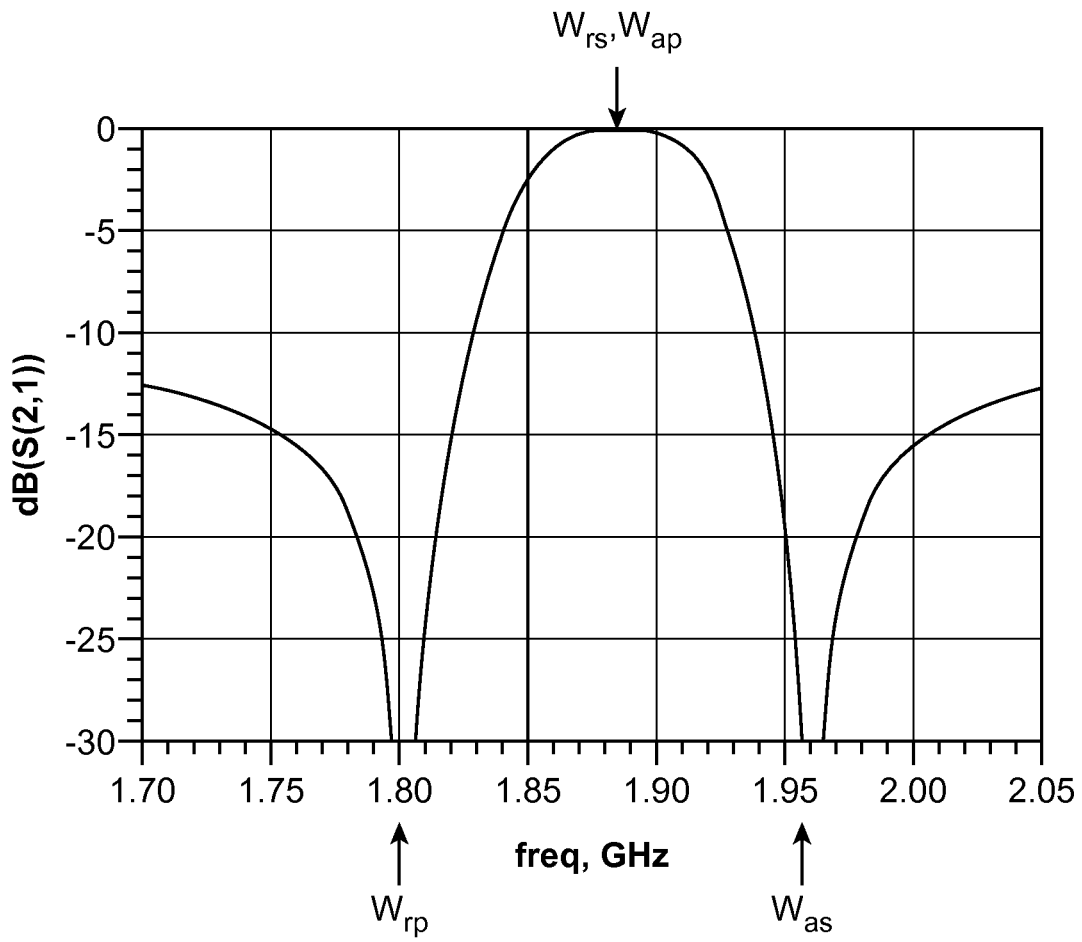
FIG. 3 is a frequency response plot of the prior art acoustic ladder filter of FIG. 2.
Figure 4A:
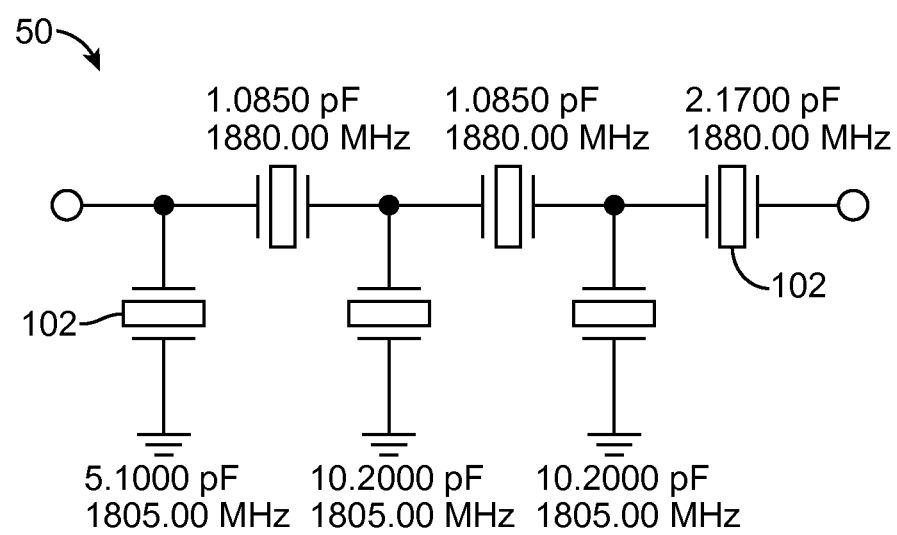
FIG. 4a is a schematic diagram of an initial circuit design of the acoustic ladder filter of FIG. 2 that can be optimized using a conventional filter optimization technique.
Figure 4B:
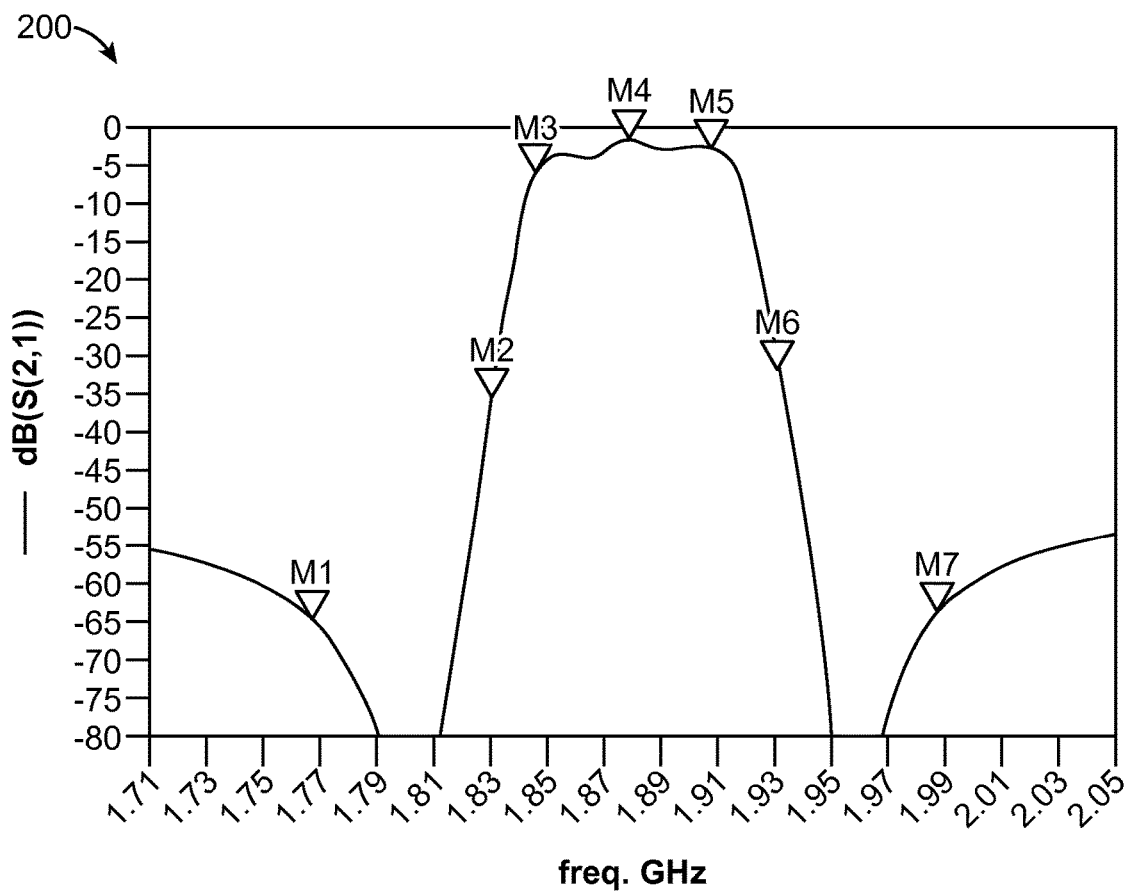
Figure 5A:
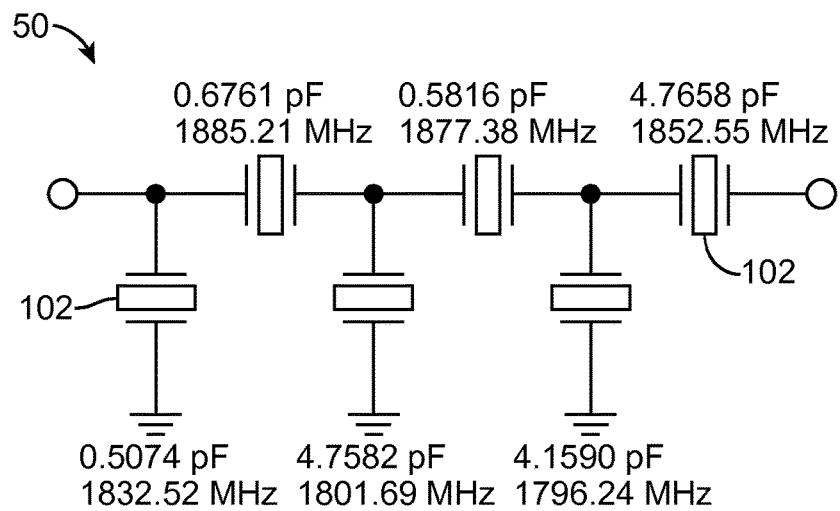
FIG. 5a is a schematic diagram of an optimized final circuit design of the acoustic ladder filter of FIG. 2 resulting from the optimization of the initial filter circuit design of FIG. 4a using the conventional filter optimization technique.
Figure 5B:
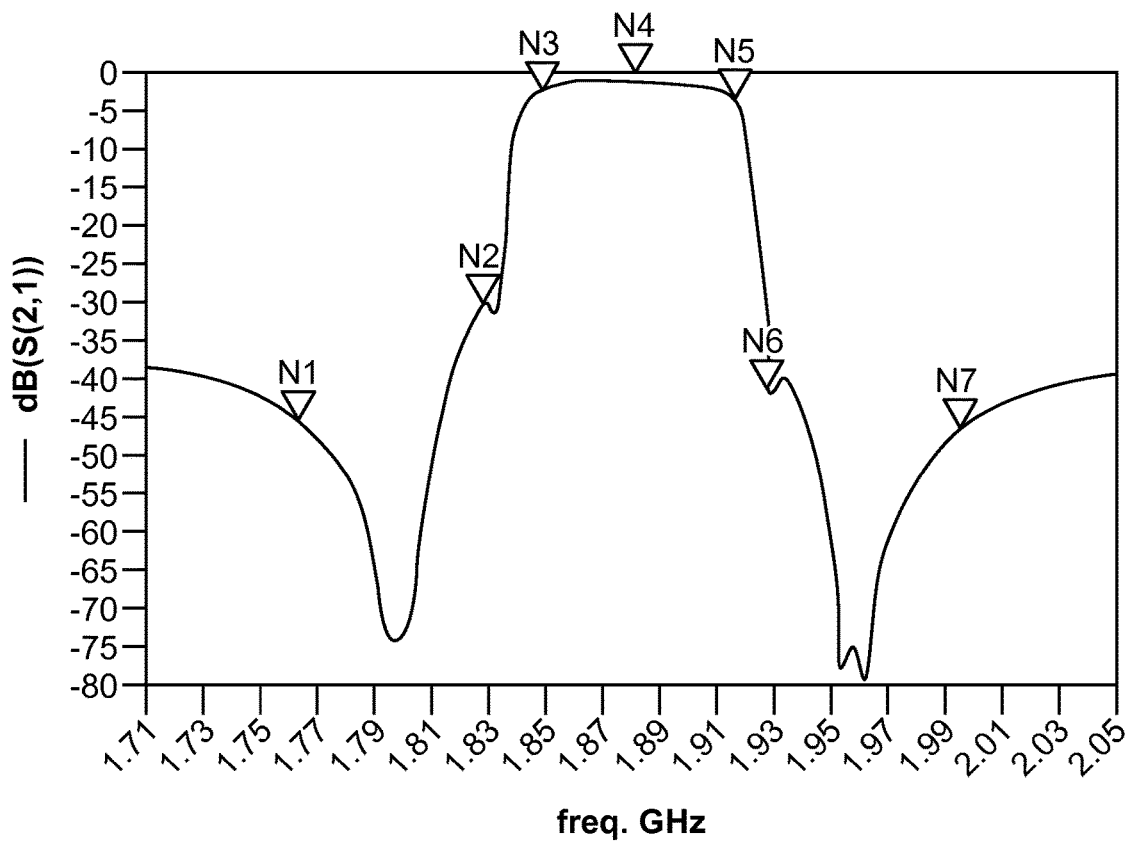
Figure 7A:
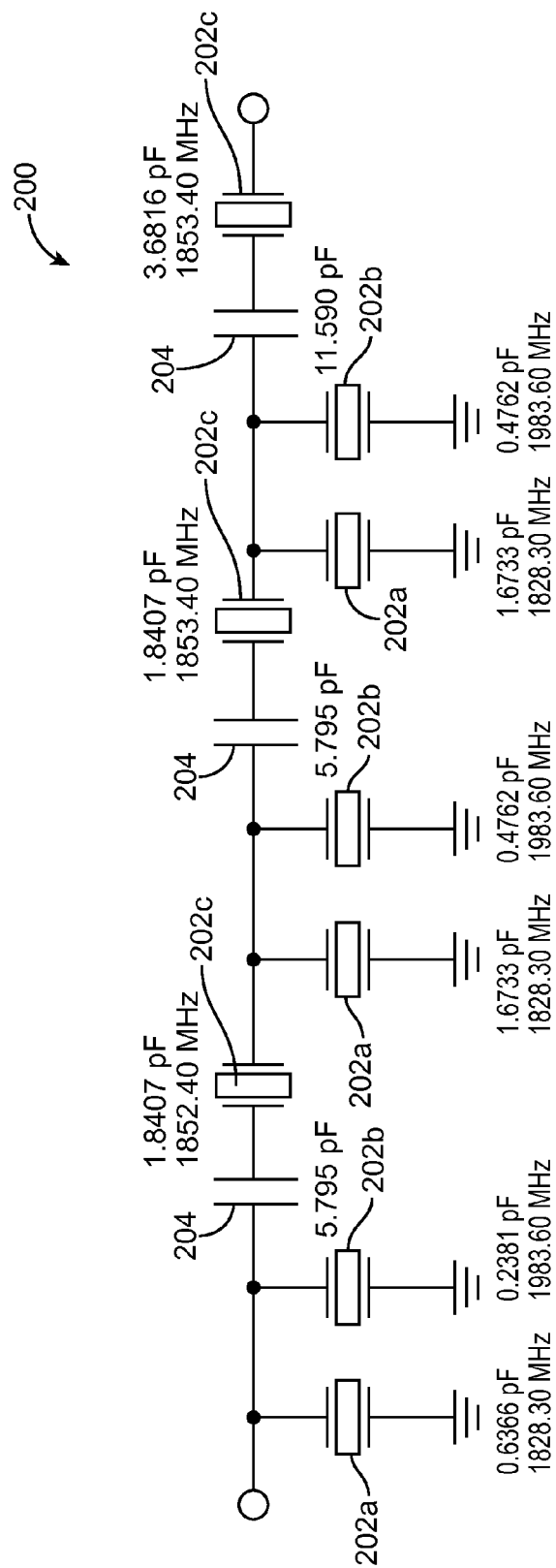
FIG. 7a is a schematic diagram of an initial circuit design of an acoustic ladder filter that can be optimized using the ERD technique of FIG. 6.

For example, as shown in FIG. 7a, the initial filter circuit design may be a band-pass ladder 200, which comprises a number of alternating shunt resonant elements 202a and 202b and series resonant elements 202c. In the illustrated embodiment, each shunt leg of the ladder filter 200 includes two parallel shunt resonant elements 202a and 202b that may resonate at different frequencies. Each of the resonant elements 202 can be modeled with the MBVD model 54 illustrated in FIG. 2. The ladder filter 200 also comprises a plurality of non-resonant elements 204 in the form of capacitors respectively associated with the series resonant elements 202c. For the purposes of this specification, a non-resonant element may refer to a passive component in a circuit. Exemplary non-resonant elements may include inductors, capacitors, switches or resistors. Non-resonant elements may have resonances far from the frequency of interest. For instance, an inductor may have a resonance greater than 50% of the passband frequency. Thus, the filter 200 includes nine resonant elements and three non-resonant elements.

Figure 7B:
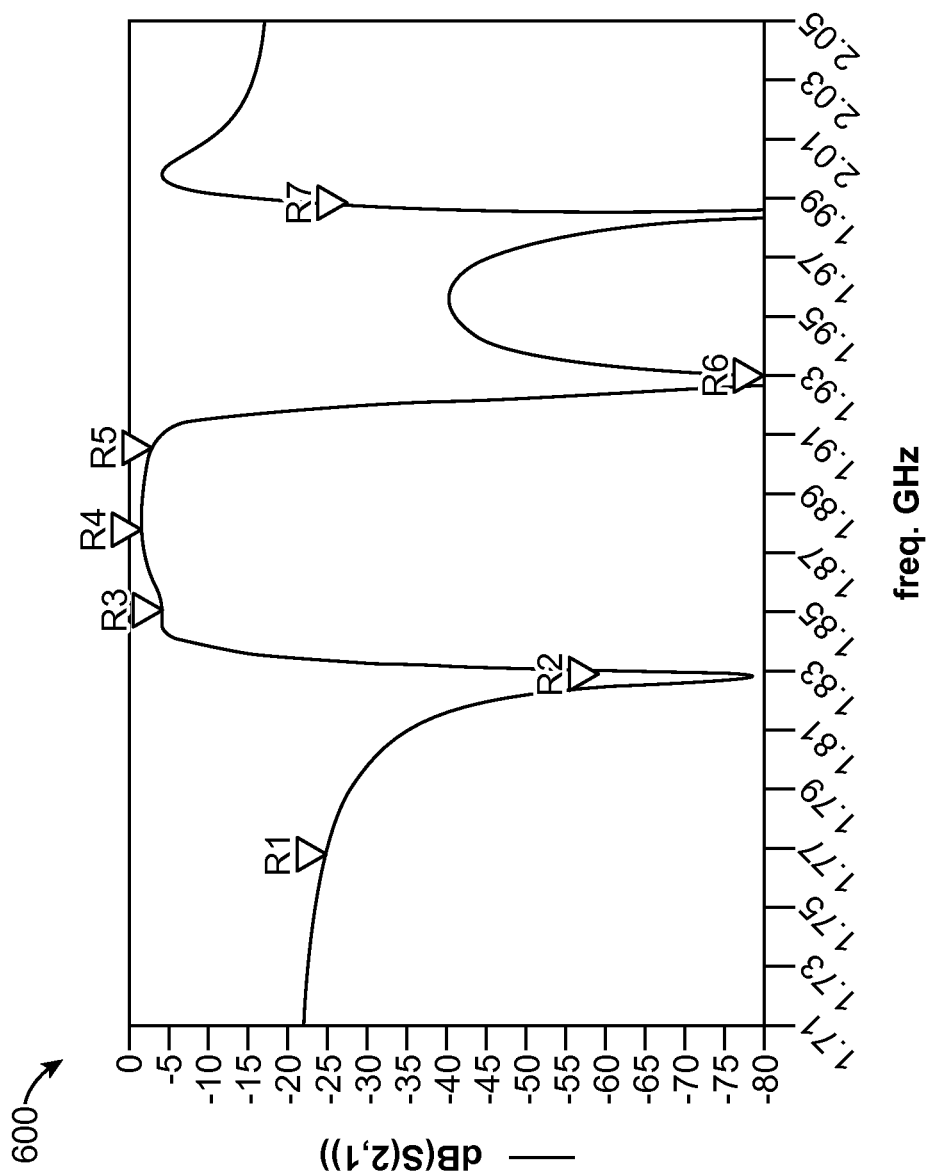

The filter 200 may initially be designed with the resonant frequencies $\omega_R$ and static capacitances $C_0$ for each resonator 202 illustrated in FIG. 7a, which when simulated, results in the frequency response illustrated in FIG. 7b. This frequency response is shown characterized by the following markers: R1 of Mag S21=−24.627 dB at frequency=1.770 GHz; R2 of Mag S21=−64.652 dB at frequency=1.830 GHz; R3 of Mag S21=−3.857 dB at frequency=1.850 GHz; R4 of Mag S21=−0.987 dB at frequency=1.881 GHz; R5 of Mag S21=−3.039 dB at frequency=1.910 GHz; R6 of Mag S21=−87.468 dB at frequency=1.930 GHz; and R7 of Mag S21=−28.429 dB at frequency=1.990 GHz. It is assumed that the circuit elements of the initial filter circuit design 200 have the following parameters: gamma $\gamma$=12, $QC_0$=200, Qcap=200, $QL_m$=1000, and Rs=0.5 ohms.

Next, the ERD technique 100 inputs the DIP (in this case the initial filter design) into a computerized filter optimizer (e.g., Agilent ADS) (step 104). For the purposes of this specification, computer optimization of a DIP may refer to improving the frequency response by changing values of the circuit elements in a computer-based circuit simulator. The circuit simulator may use goals in order to compare the simulated response against a desired result. It should be appreciated that the DIP to be computer optimized is the initial circuit design at this point, the ERD technique 100 may be implemented to improve a DIP during any point of a filter design process. At any event, the resulting DIP has the same number of circuit elements as the number of circuit elements in the input DIP.

The ERD technique 100 then determines whether any of the non-resonant elements 204 in the DIP has become insignificant ("vanishes") (step 106). For the purposes of this specification, a circuit element tends to vanish if a series element reactance value and/or shunt element susceptance value becomes very small during computer optimization at step 104 and/or the circuit element may be removed from a filter design without a significant impact on filter performance. A non-resonant element 204 may tend to vanish according to its kind and placement within the filter circuit design.

For example, if the non-resonant element 204 is a series inductor or a shunt capacitor, it will tend to vanish as its absolute impedance value becomes small; for instance, less than 0.1 nH (inductor) or 0.1 pF (capacitor). In this case, the non-resonant element 204 will be determined to be insignificant if its absolute impedance value is less than the threshold value. In contrast, if the non-resonant element 204 is a shunt inductor or a series capacitor, it will tend to vanish as its absolute impedance value becomes large; for instance, greater than 100 nH (inductor) or 50 pF (capacitor). In this case, the non-resonant element 204 will be determined to be insignificant if its absolute impedance value is greater than a threshold value.

As another example, a non-resonant element 204 will tend to vanish as its relative value (impedance or susceptance) becomes small (e.g., less than 10%) compared to other circuit elements of the same type (series or shunt) connected to them. Thus, if the non-resonant element 204 is a series circuit element, it will be determined to be insignificant if a percentage of its absolute value relative to an absolute value of another series non-resonant element 204 in the DIP is less than a threshold value. Similarly, if the non-resonant element 204 is a shunt circuit element, it will be determined to be insignificant if a percentage of its absolute value relative to an absolute value of another shunt non-resonant element 204 in the DIP is less than a threshold value.

As still another example, if the non-resonant element 204 is a series circuit element, it will tend to vanish as its impedance is less than a percentage (e.g., 10%) of the impedance seen in either direction from the non-resonant element 204. In this case, the non-resonant element 204 will be determined to be insignificant if a percentage of the absolute impedance value of the non-resonant element 204 relative to an impedance seen in either direction from the non-resonant element 204 is less than the threshold value. In contrast, if the non-resonant element 204 is a shunt circuit element, it will tend to vanish as its susceptance is less than a percentage (e.g., 10%) of the susceptance seen in either direction from the non-resonant element 204. In this case, the non-resonant element 204 will be determined to be insignificant if a percentage of the absolute susceptance value of the non-resonant element 204 relative to a susceptance seen in either direction from the non-resonant element 204 is less than the threshold value.

As yet another example, a non-resonant element 204 may tend to vanish when removing it results in less than a percentage degradation change (e.g., 10%) in a performance parameter of the filter circuit (e.g., insertion loss, rejection slope, out-of-band rejection, node voltage, group delay flatness, etc.). In this case, the non-resonant element 204 will be determined to be insignificant by removing the non-resonant element 204 from the DIP if the value of the performance parameter without the non-resonant element 204 degrades the value of the performance parameter with the non-resonant element 204 is less than a threshold value.

If it is determined that one of the non-resonant elements 204 in the DIP has become insignificant at step 106, the ERD technique 100 determines whether the sign of the insignificant non-resonant element 204 has been previously changed (i.e., whether the non-resonant element 204 has been transformed from an inductance to a capacitance, or from a capacitance to an inductance) (step 108). Of course, in the case where DIP is generated for the first time, there will be no such previous transformation. Notably, the ERD technique 100 makes this inquiry to ensure that removal of the insignificant non-resonant element 204 is preferable over transformation of the non-resonant element 204.

If the insignificant non-resonant element 204 has been previously transformed (indicating that the non-resonant element 204 vanished as both a capacitor and an inductor) at step 108, the ERD technique 100 generates a reduced filter circuit design by removing the insignificant non-resonant element 204 from the DIP (step 110). If the non-resonant element 204 has not been previously transformed (indicating that the non-resonant element 204 vanished as one of a capacitance and an inductance, but not yet as the other of the capacitance and inductance) at step 108, the ERD technique 100 modifies the DIP by changing the sign of the non-resonant element 204 (i.e., changing it from a capacitance to an inductance) (to the extent that the non-resonant element 204 is initially a capacitance) or from an inductance to a capacitance (to the extent that the non-resonant element 204 is initially a capacitance)) (step 112).

The ERD technique 100 then returns to step 104 to again optimize the DIP by inputting either the reduced filter circuit design generated in step 110 or the transformed filter circuit design generated in step 112 into the computerized filter optimizer, and then determines whether any of the remaining non-resonant elements 204 in the DIP has become insignificant at step 108. If it is determined that one of the non-resonant elements 204 in the DIP has become insignificant, the ERD technique again determines if the insignificant non-resonant element 204 has been previously transformed at step 108. In the case where the insignificant non-resonant element 204 has been previously transformed, then it is deemed that the insignificant non-resonant element 204 should have been removed from previous DIP, and thus, it is removed at step 110. In the case where the insignificant non-resonant element 204 has not been previously transformed, then the ERD technique 100 changes it at step 112.

If it is determined that none of the non-resonant elements 204 in the DIP (whether it is the first or a subsequently generated DIP) has become insignificant at step 106, the ERD technique then determines whether any of the resonant elements 202 in the DIP has become insignificant ("vanishes") (step 114). A resonant element 202 may tend to vanish when the associated transmission zero associated with the resonant element 202 is relatively far from all passbands and stopbands; for instance, when the resonant frequency $\omega_R$ and anti-resonant frequency $\omega_A$, as given in equations [1] and [2], move to more than 10% from the edge frequency of the nearest passband or stopband.

If it is determined that one of the resonant elements 202 in the DIP has become insignificant at step 114, the ERD technique modifies the DIP by replacing the insignificant resonant element 202 with a static capacitance $C_0$, which preferably has a value equal to the value of the static capacitance of the insignificant resonant element 202 (step 116). Notably, a resonant element 202 that becomes insignificant will still affect the circuit because of its static capacitance, and so is better replaced by a capacitor than removed.

The ERD technique 100 then returns to step 104 to again optimize the DIP and then determines again whether any of the non-resonant elements 204 in the DIP (including any static capacitance $C_0$ transformed from an insignificant resonant element 202) has become insignificant at step 106.

If it is determined that one of the non-resonant elements 204 in the DIP has become insignificant, the ERD technique again determines if the insignificant non-resonant element 204 has been previously transformed at step 108 and proceeds as discussed above. In the case where the insignificant non-resonant element 204 is a static capacitance $C_0$ that has replaced an insignificant resonant element 202, then it is confirmed that the insignificant circuit element (which previously was a resonant element 202, but is now a non-resonant element 204) should be entirely removed, and thus, is so removed at step 110.

If it is determined that at step 106 that none of the non-resonant elements 204 in the DIP has become insignificant, the ERD technique 100 again determines whether any of the resonant elements 202 in the DIP has become insignificant at step 114. If it is determined that one of the resonant elements 202 in the DIP has become insignificant, the ERD technique replaces the insignificant resonant element 202 with a static capacitance $C_0$ at step 116, and proceeds as discussed above.

Figure 8A:
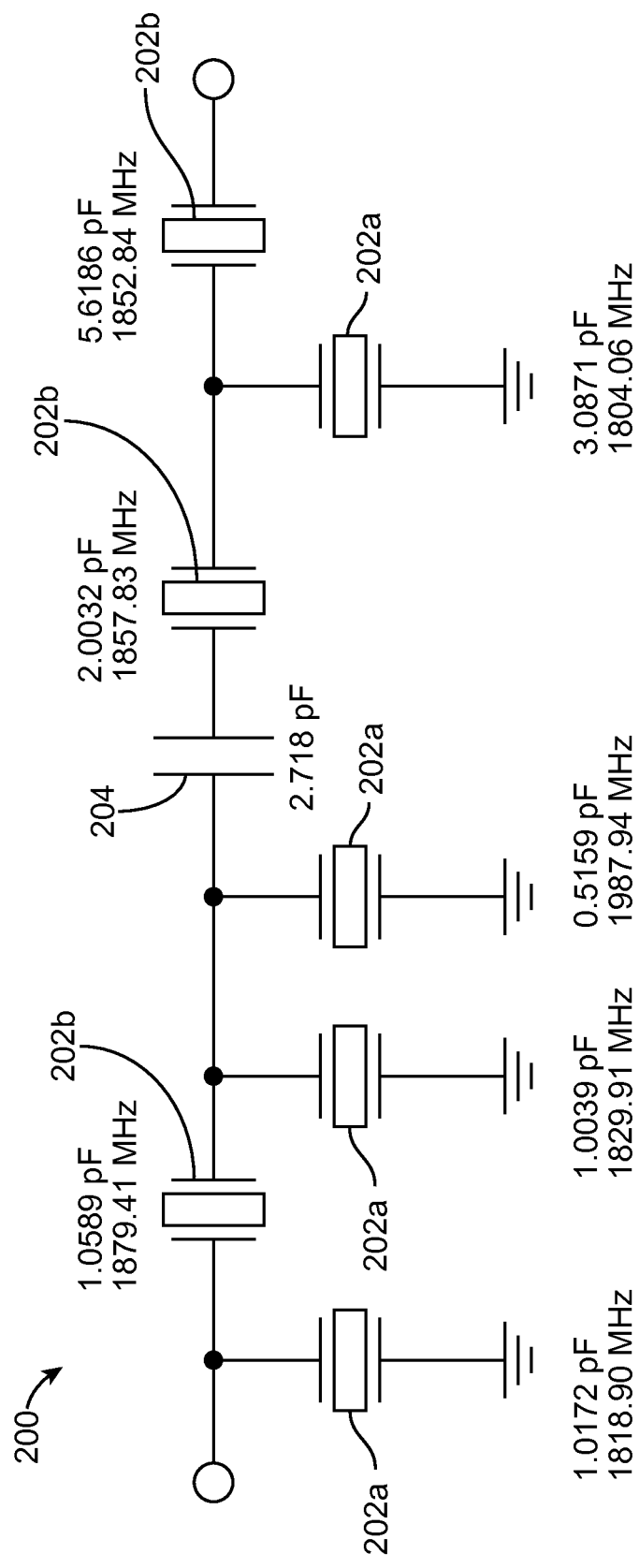
FIG. 8a is a schematic diagram of an optimized final circuit design resulting from the optimization of the initial filter circuit design of FIG. 7a using the ERD technique of FIG. 6.
Figure 8B:
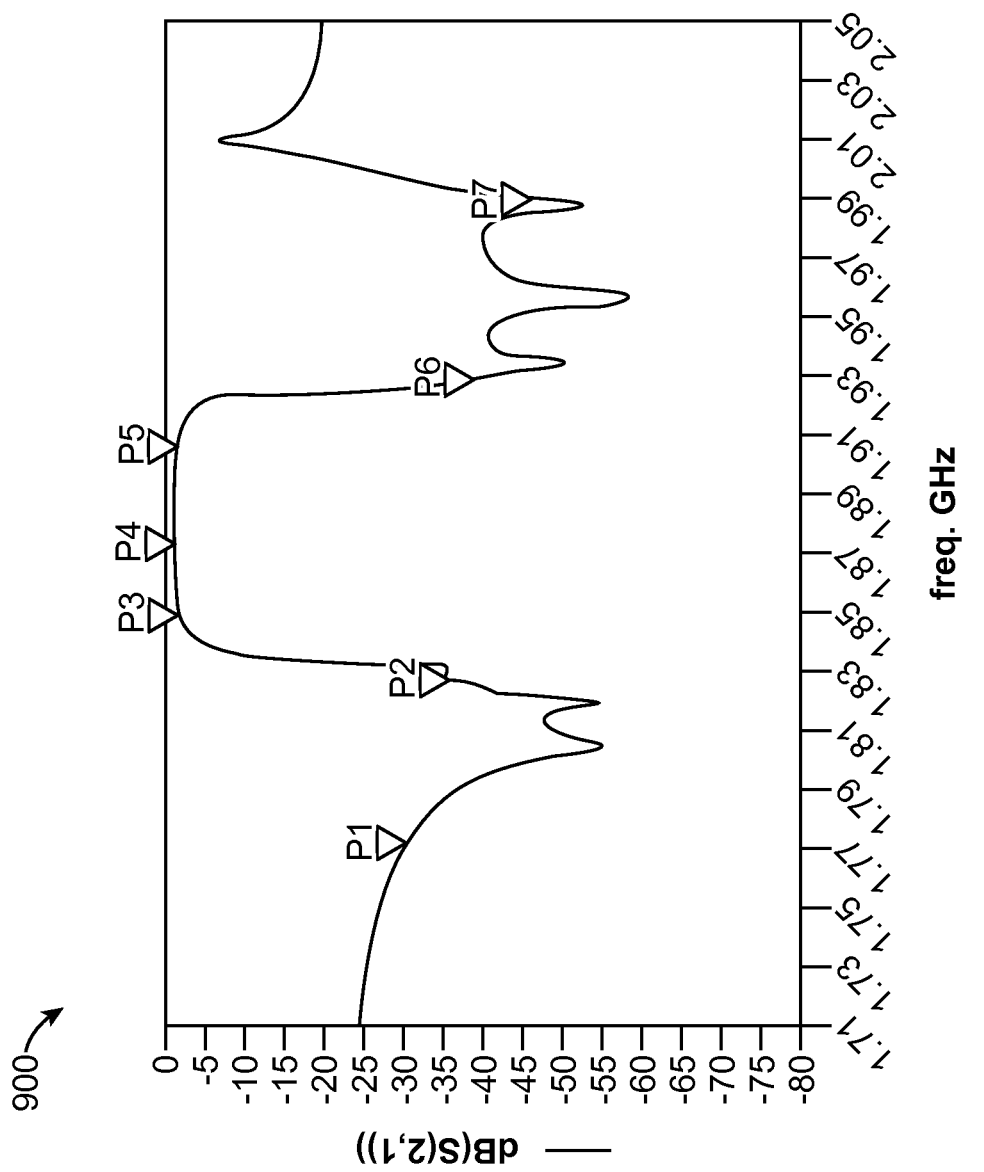

If it determined that none of the resonant elements 202 in the DIP has become insignificant, the ERD technique 100 deems the DIP to be the improved final filter circuit design (step 118), which in the exemplary embodiment, has the resonant frequencies $\omega_R$ and static capacitances $C_0$ for the remaining resonant elements 202 and non-resonant elements 204 illustrated in FIG. 8a, which when simulated, results in the frequency response illustrated in FIG. 8b. This frequency response is shown characterized by the following markers: P1 of Mag S21=−30.080 dB at frequency=1.770 GHz; P2 of Mag S21=−34.193 dB at frequency=1.830 GHz; P3 of Mag S21=−1.394 dB at frequency=1.850 GHz; P4 of Mag S21=−0.761 dB at frequency=1.872 GHz; P5 of Mag S21=−1.406 dB at frequency=1.910 GHz; P6 of Mag S21=−45.227 dB at frequency=1.930 GHz; and P7 of Mag S21=−45.227 dB at frequency=1.990 GHz.

As can be seen from a comparison between FIG. 7a and FIG. 8a, the improved final filter circuit design includes fewer circuit elements, and in particular, two less resonant elements 202 and one less non-resonant element 204. As can be seen from a comparison between FIG. 8a and FIG. 8b, the final filter circuit design yields a flatter frequency response and loss at the pass-band. It should also be noted that a conventional optimization technique (i.e., without removing circuit elements) was performed on the initial filter circuit 200 illustrated in FIG. 7a, resulting in a final filter circuit having a frequency response performance that was not as good as the frequency response performance yield by the ERT technique illustrated in FIG. 8b. Thus, contrary to conventional wisdom, the removal of circuit elements using the ERT technique not only decreased the cost and size of the microwave filter, it improves the frequency response performance of the microwave filter over prior art microwave filters that have more circuit elements.

Notably, the ERD technique 100 may analyze the frequency response of DIP resulting from step 104 in order to determine whether a previous step should be undone or redone.

For example, if the frequency response performance of the DIP is not better than the frequency response performance of the initial filter circuit design, this means that the initial filter circuit design is not acceptable, and thus, a different initial filter circuit design may be considered, which may then be inputted into the computerized filter optimizer at step 104.

As another example, if the frequency response performance of the DIP as it existed after a non-resonant element 204 has been transformed (from a capacitance to an inductance, or from an inductance to a capacitance) is worse by a threshold amount relative to the frequency response performance of the DIP as it existed before the non-resonant element 204 was transformed, the ERD technique 100 may simply return to the previous DIP and remove the non-resonant element 204 from that design.

As still another example, if the frequency response performance of the DIP as it existed after a resonant element 202 has been transformed into a static capacitance $C_0$ is worse by a threshold amount relative to the frequency response performance of the DIP as it existed before the resonant element 202 was transformed, the ERD technique may simply return to the previous DIP and restore the resonant element 204 back into that design.

Once the improved final filter circuit design is achieved, the ERD technique 100 manufactures an actual microwave filter based on the final filter circuit design (step 120). Preferably, the circuit element values of the actual microwave filter will match the corresponding circuit element values in the improved final filter circuit design.

Figure 9:
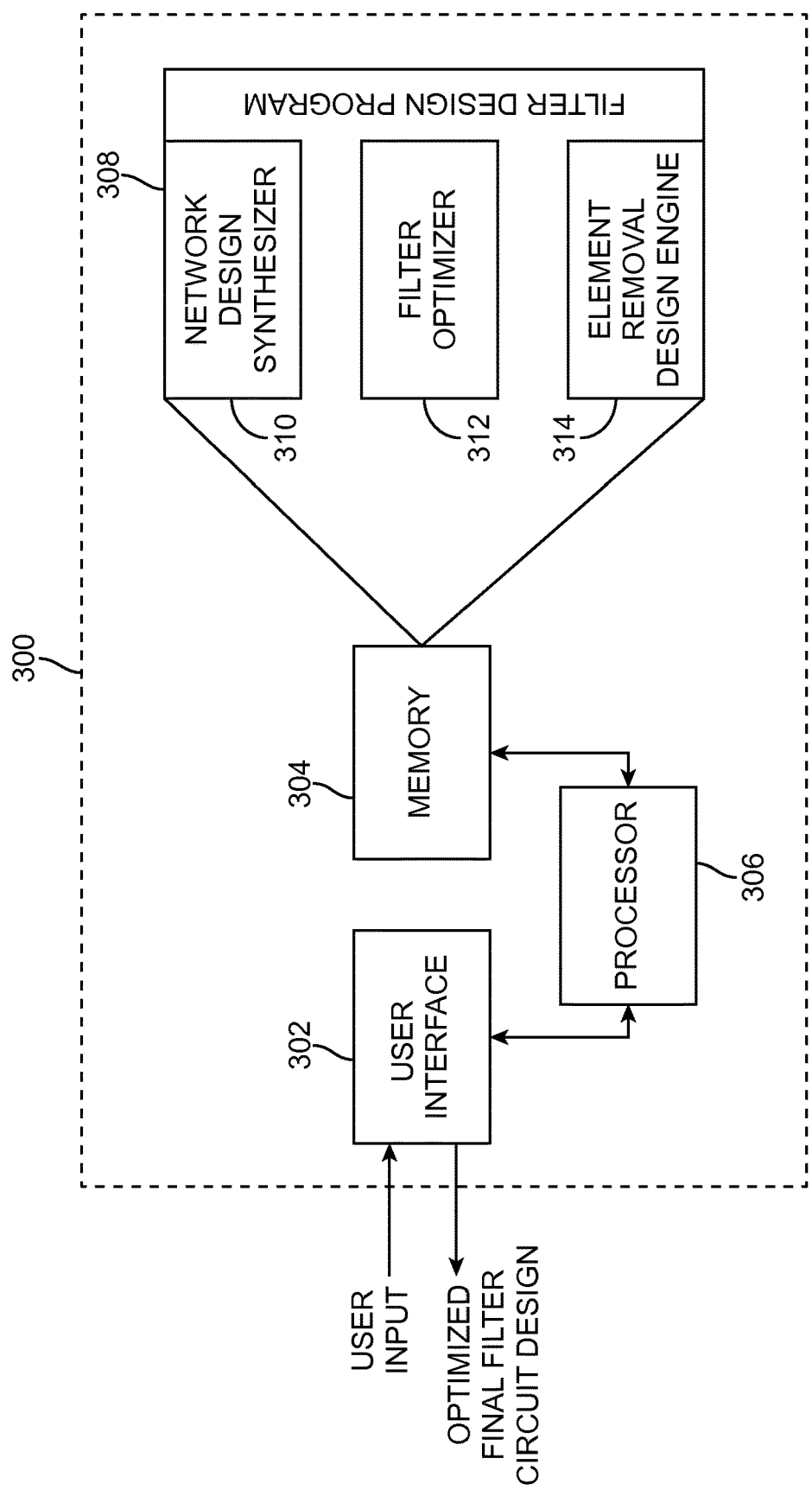
FIG. 9 is a block diagram of a computerized filter design system that can implement the computerized steps of the ERD technique of FIG. 6.

Referring first to FIG. 9, a computerized filter design system 300 may be used to design a microwave filter using the ERD technique 100. The computerized filter design system 300 generally comprises a user interface 302 configured for receiving information and data from a user (e.g., parameter values and filter specifications) and outputting an optimized filter circuit design to the user; a memory 304 configured for storing filter design software 308 (which may take the form of software instructions, which may include, but are not limited to, routines, programs, objects, components, data structures, procedures, modules, functions, and the like that perform particular functions or implement particular abstract data types), as well as the information and data input from the user via the user interface 302; and a processor 306 configured for executing the filter design software. The filter design software program 308 is divided into sub-programs, in particular, a conventional network design synthesizer 310 (which can be used to generate the initial filter circuit design at step 102), a conventional filter optimizer 312 (which can be used to generate the DIP at step 104), and an element removal design engine 314 that controls the network design synthesizer 88 and filter optimizer 90 in accordance with filter circuit design aspects of the ERD technique 100 in order to generate the optimized final circuit design.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. A system for creating a narrowband acoustic wave microwave filter comprising:
   an interface configured to receive input from a user;
   a memory configured to store filter design software; and
   a processor configured to execute the filter design software, wherein upon execution of the filter design software the system performs actions comprising:
   (a) generating a first filter circuit design based on one or more performance specifications, the first filter circuit design comprising a plurality of circuit elements, wherein the plurality of circuit elements comprises a plurality of resonant elements and one or more non-resonant elements;
   (b) generating a final filter circuit design with fewer circuit elements than the first filter circuit design, wherein the final filter circuit design exhibits a flatter passband frequency response than the first filter circuit, generating the final filter design further comprising:
      determining that at least one of the non-resonant elements in the first filter circuit design is insignificant by comparing an impedance value of the non-resonant element to a threshold value,
      determining whether the insignificant non-resonant element has previously been transformed, and
      removing the insignificant non-resonant element from the first filter circuit design based in part on a determination that the insignificant non-resonant element has previously been transformed; and
   (c) providing the final filter design as an input to a manufacturing process.

2. The system according to claim 1, wherein the insignificant non-resonant element was previously transformed from an inductance to a capacitance.

3. The system according to claim 1, wherein the insignificant non-resonant element was previously transformed from a capacitance to an inductance.

4. The system according to claim 1, the actions performed further comprising determining that at least one of the resonant elements is insignificant and transforming the insignificant resonant element to an equivalent capacitance.

5. The system according to claim 4, wherein the equivalent capacitance has a value equal to a static capacitance of the insignificant resonant element.

6. The system according to claim 1, wherein the removal of the insignificant non-resonant element results in a reduced filter circuit design, the actions performed further comprising optimizing the reduced filter circuit design by:
   determining that the reduced filter circuit design includes a second insignificant non-resonant circuit element; and
   removing the second insignificant non-resonant circuit element from the reduced filter circuit design based in part on a determination that the second insignificant non-resonant circuit element has previously been transformed.

7. The system according to claim 6, wherein the second insignificant non-resonant circuit element was previously transformed from an inductance to a capacitance.

8. The system according to claim 6, wherein the second insignificant non-resonant circuit element was previously transformed from a capacitance to an inductance.

9. The system according to claim 6, the actions performed further comprising:
determining the reduced filter circuit design includes an insignificant resonant element; and
transforming said insignificant resonant element to an equivalent capacitance.

10. The system of claim 9, wherein the equivalent capacitance has a value equal to the value of a static capacitance of the insignificant resonant element.

11. The system of claim 6, the actions performed further comprising:
generating a final filter design at least in part upon a determination that no remaining circuit elements in the reduced filter design are insignificant.

12. The system of claim 1, wherein the insignificant non-resonant element is either a series inductor or a shunt capacitor that is determined to be insignificant if the absolute impedance value is less than the threshold value.

13. The system of claim 1, wherein the insignificant non-resonant element is either a shunt inductor or a series capacitor that is determined to be insignificant if the absolute impedance value is greater than the threshold value.

14. The system of claim 1, wherein the final filter design is generated at least in part upon a determination that no remaining resonant elements are insignificant.

15. A non-transitory computer-readable medium having stored thereon instructions that, when executed by a processor, enable the processing device to perform a method for creating a narrowband acoustic wave microwave filter, the method comprising:
(a) generating a first filter circuit design based on one or more performance specifications, the first filter circuit design comprising a plurality of circuit elements, wherein the plurality of circuit elements comprises a plurality of resonant elements and one or more non-resonant elements,
(b) generating a final filter circuit design with fewer circuit elements than the first filter circuit design, wherein the final filter circuit design exhibits a flatter passband frequency response than the first filter circuit, generating the final filter design further comprising:
determining that at least one of the non-resonant elements in the first filter circuit design is insignificant by comparing an impedance value of the non-resonant element to a threshold value,
determining whether said insignificant non-resonant element has previously been transformed, and
removing said insignificant non-resonant element from the first filter circuit design based in part on a determination that said insignificant non-resonant element has previously been transformed, and
(c) providing the final filter design as an input to a manufacturing process.

16. The medium according to claim 14, wherein the insignificant non-resonant element was previously transformed from an inductance to a capacitance.

17. The medium according to claim 15, wherein the insignificant non-resonant element was previously transformed from a capacitance to an inductance.

18. The medium according to claim 15, wherein the method further comprises determining that at least one of the resonant elements is insignificant and transforming the insignificant resonant element to a capacitance.

19. The medium according to claim 18, wherein the equivalent capacitance has a value equal to a static capacitance of the insignificant resonant element.

20. The medium according to claim 15, wherein the removal of the insignificant non-resonant element results in a reduced filter circuit design comprising a plurality of circuit elements, the method further comprising optimizing the reduced filter circuit design by:
determining that the reduced filter circuit design includes a second insignificant non-resonant element; and
removing the second insignificant non-resonant element from the reduced filter circuit design based in part on a determination that the second insignificant non-resonant element has previously been transformed.

21. The medium according to claim 20, wherein the second non-resonant element was previously transformed from an inductance to a capacitance.

22. The medium according to claim 20, wherein the second non-resonant element was previously transformed from a capacitance to an inductance.

23. The medium according to claim 20, the method further comprising:
determining the reduced filter circuit design includes an insignificant resonant element, and
transforming the insignificant resonant element to an equivalent capacitance.

24. The medium of claim 23, wherein the equivalent capacitance has a value equal to a static capacitance of the insignificant resonant element.

25. The medium of claim 20, the method further comprising:
generating the final filter design at least in part upon a determination that no remaining circuit elements in the reduced filter design are insignificant.

26. The medium of claim 15, wherein the non-resonant element is either a series inductor or a shunt capacitor that is determined to be insignificant if the impedance value is less than the threshold value.

27. The medium of claim 15, wherein the non-resonant element is either a shunt inductor or a series capacitor that is determined to be insignificant if the impedance value is greater than the threshold value.

* * * * *